United States Patent
Choi

(10) Patent No.: US 12,268,034 B2
(45) Date of Patent: Apr. 1, 2025

(54) SPAD PIXEL STRUCTURE AND METHOD OF MANUFACTURING SAME

(71) Applicant: DB HiTek Co., Ltd., Bucheon-si (KR)

(72) Inventor: Byoung Soo Choi, Suwon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 519 days.

(21) Appl. No.: 17/573,412

(22) Filed: Jan. 11, 2022

(65) Prior Publication Data
US 2022/0271183 A1 Aug. 25, 2022

(30) Foreign Application Priority Data
Feb. 25, 2021 (KR) ................. 10-2021-0025375

(51) Int. Cl.
| | | |
|---|---|---|
| H10F 30/225 | (2025.01) | |
| H10F 39/00 | (2025.01) | |
| H10F 71/00 | (2025.01) | |
| H10F 77/20 | (2025.01) | |

(52) U.S. Cl.
CPC ......... *H10F 30/225* (2025.01); *H10F 39/011* (2025.01); *H10F 39/811* (2025.01); *H10F 71/139* (2025.01); *H10F 77/206* (2025.01)

(58) Field of Classification Search
CPC ............. H01L 31/107; H01L 27/14636; H01L 27/14683; H01L 31/022408; H01L 31/1892; H01L 27/14609; H01L 27/14689
See application file for complete search history.

(56) References Cited

U.S. PATENT DOCUMENTS

| | | | | |
|---|---|---|---|---|
| 6,738,109 | B2* | 5/2004 | Jeon ................. | G02F 1/13454 349/151 |
| 7,016,005 | B2* | 3/2006 | Koike ............... | G02F 1/133514 349/139 |
| 7,129,520 | B2* | 10/2006 | Kim .................. | G02F 1/1309 349/147 |
| 8,476,730 | B2* | 7/2013 | Sanfilippo ......... | H01L 31/107 257/428 |
| 10,204,950 | B1* | 2/2019 | Yamashita ......... | H01L 27/14621 |
| 10,672,934 | B2 | 6/2020 | Wang et al. | |
| 10,720,484 | B2* | 7/2020 | Zhang ............... | H10D 86/60 |
| 11,209,709 | B2* | 12/2021 | Cui .................. | H10D 86/60 |
| 2005/0110932 | A1* | 5/2005 | Chang ............... | G02F 1/136227 349/141 |
| 2005/0280747 | A1* | 12/2005 | Nakayoshi ........ | G02F 1/1368 349/38 |
| 2006/0061700 | A1* | 3/2006 | Chung .............. | G02F 1/136213 349/38 |
| 2009/0008566 | A1* | 1/2009 | Agarwal ........... | H10F 39/189 257/438 |
| 2009/0174833 | A1* | 7/2009 | Chen ................ | G02F 1/136286 349/44 |

(Continued)

FOREIGN PATENT DOCUMENTS

KR 10-2019-0049598 A 5/2019

*Primary Examiner* — Caleb E Henry
(74) *Attorney, Agent, or Firm* — Andrew D. Fortney; Central California IP Group, P.C.

(57) ABSTRACT

Disclosed are a SPAD pixel structure and a method of manufacturing the same, in which a cathode contact is formed on a back surface of a substrate instead of a front surface, thereby reducing or minimizing the distance between adjacent unit pixels and increasing the fill-factor of each unit pixel.

8 Claims, 12 Drawing Sheets

(56) References Cited

U.S. PATENT DOCUMENTS

| | | | |
|---|---|---|---|
| 2011/0241149 A1* | 10/2011 | Mazzillo | H10F 77/206 |
| | | | 257/438 |
| 2016/0329361 A1* | 11/2016 | Du | H01L 21/0274 |
| 2017/0092801 A1* | 3/2017 | Moussy | H01L 31/107 |
| 2018/0190747 A1* | 7/2018 | Son | H01L 25/0753 |
| 2019/0103433 A1* | 4/2019 | Yamashita | H01L 27/14647 |
| 2019/0103504 A1* | 4/2019 | Yamashita | H01L 27/14636 |
| 2019/0131478 A1 | 5/2019 | Wang et al. | |
| 2020/0279969 A1 | 9/2020 | Wang et al. | |
| 2021/0149235 A1* | 5/2021 | Jeong | G02F 1/13454 |
| 2021/0151490 A1* | 5/2021 | Sulfridge | H10F 30/2255 |

* cited by examiner

SPAD PIXEL STRUCTURE AND METHOD OF MANUFACTURING SAME

CROSS REFERENCE TO RELATED APPLICATION

The present application claims priority to Korean Patent Application No. 10-2021-0025375, filed Feb. 25, 2021, the entire contents of which are incorporated herein for all purposes by this reference.

BACKGROUND OF THE INVENTION

Field of the Invention

The present disclosure relates to a single-photon avalanche diode (SPAD) pixel structure and a method of manufacturing the same, including a cathode contact on a back surface of the substrate instead of a front surface, thereby minimizing the distance between adjacent unit pixels and increasing the fill-factor of each unit pixel.

Description of the Related Art

In general, single-photon avalanche diodes, referred to as SPADs, are used as photoelectric conversion elements in an imaging device. The SPADs have a P-N junction to detect incident radiation and operate in the Geiger mode (i.e., at a voltage well above a breakdown voltage of the single-photon avalanche diode, also referred to as an "avalanche voltage"). Since a voltage exceeding the breakdown voltage is applied to the SPAD, carriers generated by photoelectric conversion trigger an electron avalanche, and the SPAD enters a breakdown state. As a result, multiplication of carriers on the basis of the photoelectric conversion may occur, and the sensitivity of the imaging device improves.

FIG. 1 is a plan view illustrating a SPAD pixel structure 9 according to the related art; FIG. 2 is a cross-sectional view taken along line a-a' in FIG. 1; FIG. 3 is a plan view illustrating an improved SPAD pixel structure 9' according to the related art; and FIG. 4 is a cross-sectional view taken along line b-b' in FIG. 3.

Hereinafter, the SPAD pixel structures 9 and 9' according to the related art and their problems will be described in detail with reference to the accompanying drawings.

Referring to FIGS. 1 and 2, the SPAD pixel structure 9 according to the related art has a structure including a first conductivity type substrate 910 having a front surface 911 and a back surface 913, a lower N-well 920, and an upper N-well 930 on the lower N-well 920 and surrounding a P-well 940. In addition, a heavily doped region 931 is on the upper N-well 930 to be electrically connected to a cathode, and a heavily doped region 941 is on the P-well 940 to be electrically connected to an anode. As described above, in the structure 9 according to the related art, both cathode contact and anode contact are made on the front surface 911 of the substrate 910, which means that some distance between adjacent unit pixels is inevitable. Also, it is difficult to increase the fill-factor above a certain level, resulting in spatial loss.

Referring to FIGS. 3 and 4, the improved pixel structure 9' for overcoming such a problem has a structure in which upper N-wells 930' between each unit pixel P overlap each other. This is advantageous over the structure 9, because the fill-factor can increase by reducing the distance between adjacent unit pixels. However, since each upper N-well 930' still surrounds the outer peripheral edge of the P-wells 940', a limit in reducing the distance between unit pixels remains.

To solve the above problems, the inventors of the present disclosure have created a novel improved SPAD structure and a method of manufacturing the same.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Korean Patent Application Publication No. 10-2019-0049598 "SPAD image sensor and associated fabricating method"

SUMMARY OF THE INVENTION

Accordingly, the present disclosure has been made keeping in mind the above problems occurring in the related art, and an objective of the present disclosure is to provide a SPAD pixel structure and a method of manufacturing the same, including an anode contact and a cathode contact on a front surface and a back surface of a substrate, respectively. Unlike the related-art structure(s), the present SPAD pixel structure does not include an upper N-well and a P-well that are horizontally parallel. This enables a reduction in the distance between adjacent unit pixels, and thus increases the fill-factor of each unit pixel.

Another objective of the present disclosure is to provide a SPAD pixel structure and a method of manufacturing the same, including a P-N junction at a position adjacent to a front surface of a substrate, thereby improving the photon detection probability (PDP) of near-infrared light (e.g., having a long wavelength relative to visible light).

Still another objective of the present disclosure is to provide a SPAD pixel structure and a method of manufacturing the same that, unlike the related-art structure(s), does not include an upper N-well in parallel with a P-well, so that it is relatively easy to adjust/change the position (e.g., the height or depth in the substrate) of a P-N junction during manufacture.

In order to achieve the above objectives, the present disclosure may be implemented by embodiments having one or more of the following configurations.

According to one embodiment of the present disclosure, there is provided a SPAD pixel structure including a substrate having a front surface and a back surface; a second conductivity type first impurity region in the substrate; a second conductivity type second impurity region in the substrate on the first impurity region; a first conductivity type anode contact in the substrate on the second impurity region; and a connection region extending from the back surface of the substrate to a back surface of the first impurity region and comprising a conductive metal.

According to another embodiment of the present disclosure, the second impurity region may have an upper surface adjacent or proximal to the front surface of the substrate.

According to another embodiment of the present disclosure, the second impurity region and the anode contact may form a P-N junction adjacent or proximal to the front surface of the substrate.

According to another embodiment of the present disclosure, the SPAD pixel structure may further include an insulating layer on the back surface of the substrate; and a metal contact through the insulating layer, comprising a conductive metal, and electrically connected to the connection region.

According to another embodiment of the present disclosure, the SPAD pixel structure may further include a metal wire or line on a back surface of the insulating layer.

According to another embodiment of the present disclosure, there is provided a SPAD pixel structure including a substrate having a front surface and a back surface; a second conductivity type first impurity region across a plurality of unit pixels in the substrate; a second conductivity type second impurity region in each of the unit pixels in the substrate on the first impurity region; a first conductivity type anode contact in each of the unit pixels in the substrate on the second impurity region; and connection regions extending from the back surface of the substrate to a back surface of the first impurity region, spaced apart from each other.

According to another embodiment of the present disclosure, the SPAD pixel structure may further include an insulating layer on the back surface of the substrate; and metal contacts through the insulating layer, each metal contact being electrically connected to an associated one of the connection regions; and metal wires or lines on a back surface of the insulating layer, electrically connected to the metal contacts.

According to another embodiment of the present disclosure, the metal wires or lines may be in a matrix.

According to another embodiment of the present disclosure, the SPAD pixel structure may further include a device isolation layer in the substrate at a boundary between adjacent unit pixels.

According to another embodiment of the present disclosure, the SPAD pixel structure may further include a first conductivity type read-out region at a boundary of an outermost unit pixel.

According to another embodiment of the present disclosure, there is provided a method of manufacturing a SPAD pixel structure, the method including forming a first impurity region, a second impurity region, an anode contact, and a device isolation layer on or adjacent to a front surface of a substrate; forming an insulating layer, a metal contact, and a metal wire or line on the front surface of the substrate; attaching a support substrate to the front surface of the substrate; and forming a connection region extending from a back surface of the substrate to the first impurity region.

According to another embodiment of the present disclosure, the connection region may be formed by etching a hole from the back surface of the substrate to a back surface of the first impurity region; and filling the hole with a conductive metal or metal material.

According to another embodiment of the present disclosure, filling the hole with the conductive metal may include depositing the conductive metal or metal material in the hole and on the back surface of the substrate; and planarizing the metal or metal material to expose the back surface of the substrate.

According to another embodiment of the present disclosure, the method may further include forming an insulating layer on the back surface of the substrate; forming a metal contact through the insulating layer and electrically connected to the connection region; and forming a metal wire or line on a back surface of the insulating layer (e.g., in contact with the metal contact).

According to another embodiment of the present disclosure, there is provided a method of manufacturing a SPAD pixel structure, the method including forming a second conductivity type first impurity region in a substrate; forming a second conductivity type second impurity region on the first impurity region; forming a first conductivity type anode contact on the second impurity region in or on a front surface of the substrate; forming an insulating layer, a metal contact, and a metal wire or line on the front surface of the substrate; attaching a support substrate to the front surface of the substrate; forming connection regions extending from the back surface of the substrate (or the support substrate) to the first impurity region and comprising a conductive metal, forming an insulating layer on the back surface of the substrate (or the support substrate); forming metal contacts through the insulating layer, each metal contact being electrically connected to an associated one of the connection regions; and forming metal wires or lines on a back surface of the insulating layer (e.g., in contact with the metal contacts).

According to another embodiment of the present disclosure, the method may further include thinning the back surface of the substrate before forming the connection regions.

According to another embodiment of the present disclosure, the metal contacts and the connection regions may not overlap the anode contact in a vertical direction.

According to another embodiment of the present disclosure, the metal wires or lines may not overlap the anode contact in the vertical direction, and may be in a grid or matrix.

The above configurations have the following effects.

The anode contact and the cathode contact are on the front surface and the back surface of the substrate, respectively. Thus, unlike the related-art structure(s), the upper N-well is not parallel with the P-well in the horizontal direction. This enables a reduction in the distance between adjacent unit pixels, and thus increases the fill-factor of each unit pixel.

In addition, the P-N junction is adjacent (e.g., closer relative to the related-art structure[s] in FIGS. 1-4) to the front surface of the substrate, thereby improving the photon detection probability (PDP) of near-infrared light.

In addition, unlike the related-art structure(s), the upper N-well is not parallel with the P-well, so that it is relatively easy to adjust/change the position (or the height or depth in the substrate) of the P-N junction during manufacture.

Meanwhile, the effects of the present disclosure are not limited to the effects described above, and other effects not stated explicitly can be understood from the following description and claims.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings. The embodiments of the present disclosure can be modified in various forms. Therefore, the scope of the disclosure should not be construed as being limited to the following embodiments, but should be construed on the basis of the descriptions in the appended claims. The embodiments of the present disclosure are provided for complete disclosure of the present disclosure and to fully convey the scope of the present disclosure to those ordinarily skilled in the art.

As used herein, the singular forms are intended to include the plural forms as well, unless the context clearly indicates otherwise. It will be further understood that the terms "comprise" and/or "comprising", etc. when used in this specification, specify the presence of stated features, integers, steps, operations, elements, components, and/or combinations thereof, but do not preclude the presence or addition of one or more other features, integers, steps, operations, elements, components, and/or combinations thereof.

It will be understood that when an element (or layer) is referred to as being on another element (or layer), it can be directly on the other element, or one or more intervening elements or layers may be therebetween. In contrast, when an element is referred to as being directly on or above another component, no intervening elements are therebetween. Note that the terms "on", "above", "below", "upper", "lower", etc. are intended to describe one element's relationship to one or more other elements, as may be illustrated in the figures.

While the terms "first", "second", "third", etc. may be used herein to describe various items such as various elements, regions and/or parts, these items should not be limited by these terms.

When a certain embodiment may be implemented differently, a specific process order may be performed differently from the described order. For example, two consecutively described processes may be performed substantially at the same time or performed in an order opposite to the described order.

In addition, the conductivity type or doped region of the elements may be defined as "P-type" or "N-type," according to the main carrier characteristics. However, this is only for convenience of description, and the technical spirit of the present disclosure is not limited to the above-mentioned examples. For example, "P-type" or "N-type" may be replaced with the more general terms "first conductivity type" or "second conductivity type" hereinafter, where "first conductivity type" may refer to P-type, and "second conductivity type" may refer to N-type.

It should be further understood that the terms "heavily doped" and "lightly doped" representing the dose or doping concentration of an impurity region refers to the dose or concentration of dopant elements of the impurity region relative to one or more other impurity regions.

Figure 5:
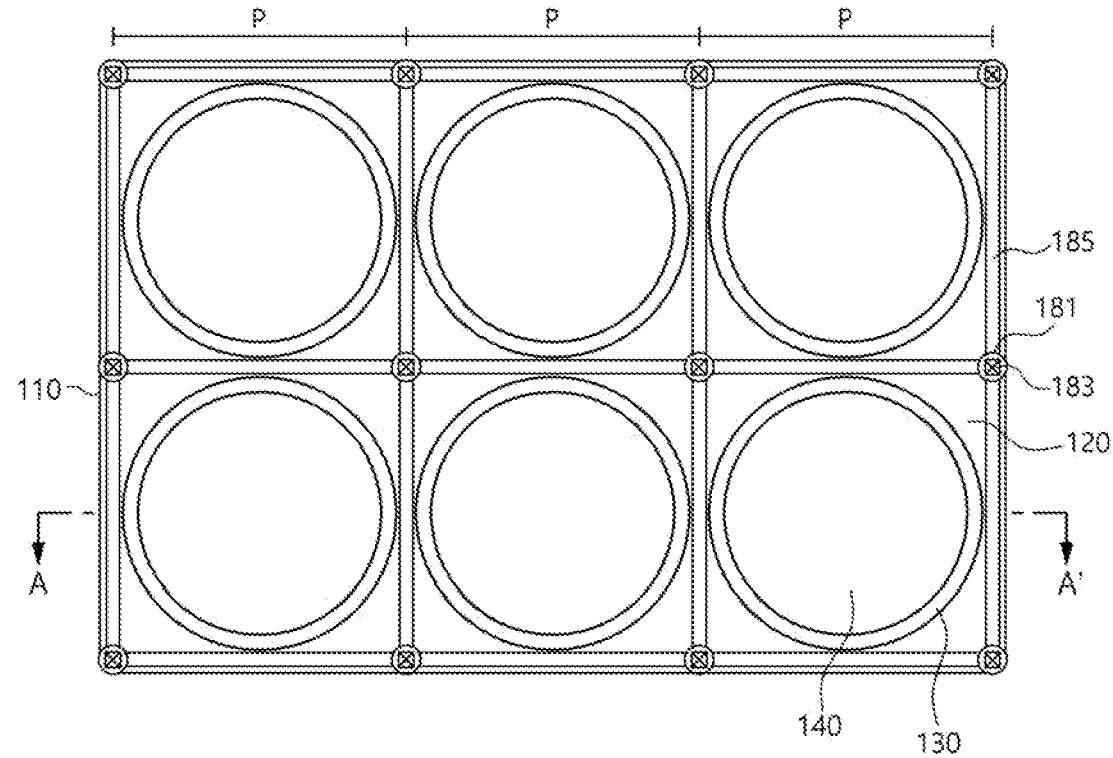
FIG. 5 is a plan view illustrating a SPAD pixel structure according to one or more embodiments of the present disclosure.
Figure 6:
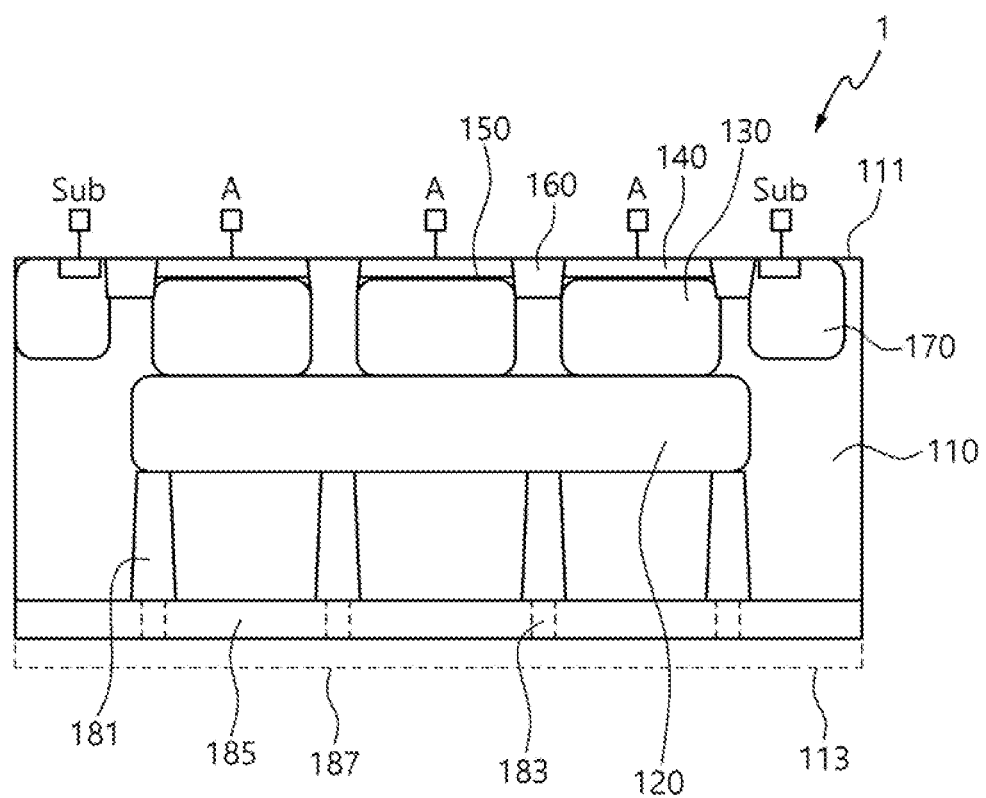
FIG. 6 is a cross-sectional view taken along line A-A' of FIG. 5.

FIG. 5 is a plan view illustrating a SPAD pixel structure 1 according to one or more embodiments of the present disclosure, and FIG. 6 is a cross-sectional view taken along line A-A' of FIG. 5.

Hereinafter, the SPAD pixel structure 1 according to embodiment(s) of the present disclosure will be described in detail with reference to the accompanying drawings.

Referring to FIGS. 5 and 6, the SPAD pixel structure 1 according to the present disclosure includes a cathode contact on a back surface of a substrate instead of the front surface, thereby enabling to the distance between adjacent unit pixels to be minimized and the fill-factor of each unit pixel to be increased or maximized. As will be described in detail below, in the case of the SPAD pixel structure 1 according to the present disclosure, the area of the cathode contact is not on the front surface of the substrate, thereby significantly reducing the distance between unit pixels. In addition, it should be noted that the SPAD pixel structure 1 according to the present disclosure is based on back-side illumination (BSI) technology.

The SPAD pixel structure 1 according to the present disclosure includes a lightly doped first conductivity type substrate 110. The substrate 110 has a front surface 111 and a back surface 113. Light is incident on the back surface 113 of the substrate 110. A first impurity region 120, which is a second conductivity type impurity doped region that may serve as a lower N-well, is in the substrate 110. A second impurity region 130, which is a second conductivity type impurity doped region that may serve as an upper N-well, is in the substrate 110 on the first impurity region 120.

A plurality of second impurity regions 130 may be in a plurality of unit pixels P spaced apart from each other along a horizontal direction. That is, one second impurity region 130 may be in each unit pixel P. The first impurity region 120 and the second impurity region 130 may have a shape in a plan view of, for example, a circle, a disk, an oval, a rectangle or square with rounded corners, etc. Although three second impurity regions 130 are illustrated in the drawings, this is an arbitrary number, and it may vary depending on the number of unit pixels P.

An anode contact 140 may be in or on the front surface 111 of the substrate 110 on each of the second impurity regions 130. The anode contact 140 may comprise a heavily doped first conductivity type region, and may be electrically connected to an anode A. The first impurity region 120, the second impurity region 130, and the anode contact 140 may all have the same shape (e.g., in the plan view). A P-N junction 150 is formed at the boundary between the first conductivity type anode contact 140 and the second conductivity type second impurity region 130. As described above, since the anode contact 140 is on the front surface 111 of the substrate 110, the P-N junction 150 may be adjacent, proximal or close to the front surface 111 of the substrate 110.

In general, when light from an object is incident on the back surface 113, the light reaches the second impurity region 120 (e.g., at its top or uppermost surface), generating carriers through photoelectric to conversion. In addition, a reverse bias voltage is applied to the SPAD 1. Specifically, a positive polarity voltage may be applied to the cathode (not shown, but which are electrically connected to the metal contacts 183), while a negative polarity voltage may be applied to the anode A. As a result, a depletion region is formed by the P-N junction at the interface between each of the first conductivity type anode contacts 140 and each of the second conductivity type second impurity regions 130. The voltage applied to the SPAD 1 may be distributed to the respective depletion regions.

The depletion region(s) to which a reverse bias voltage above the breakdown voltage is applied may be or comprise an avalanche region, which may also be a region in which carrier multiplication occurs. Such carrier multiplication is a phenomenon where electrons accelerated by a strong electric field in a depletion layer cause collision ionization, thereby generating new carriers.

In addition, a time-of-flight (ToF) sensor mainly uses a near-infrared wavelength (e.g., a 900 nm-containing band), and the corresponding near-infrared light has a small absorption coefficient and can thus reach a deep position of the substrate 110 without being absorbed. In this case, when the P-N junction 150 is not deep from the back surface 113 (e.g., toward the front surface 111) of the substrate 110, a problem may arise in improving the sensitivity of the imaging device (e.g., to near-infrared light).

An advantage of the SPAD pixel structure 1 according to the present disclosure is that the depletion region is formed adjacent or proximal to the front surface 111 of the substrate 110 to improve photon detection probability (PDP) of near-infrared light. In addition, unlike the related-art structure(s), a separate cathode contact is not formed on the front surface 111 of the substrate 111, which makes it relatively easy to adjust/change the position of the P-N junction 150 during manufacture. Therefore, another advantage of the structure 1 according to the present disclosure is that it is easy to adjust the position of the P-N junction 150 to a desired level (e.g., height or depth).

A device isolation layer 160 is at the boundary between adjacent unit pixels P. The device isolation layer 160 may be formed by shallow trench isolation (STI), but is not limited thereto.

A read-out region 170 may be in or on the front surface 111 of the substrate 110, at the boundary (e.g., a peripheral or outermost boundary) of an outermost unit pixel P. The read-out region 170 is a first conductivity type impurity doped region. The read-out region 170 is heavily doped and may be connected to a ground potential.

A connection region 181 may penetrate the substrate 110 from a back surface of the first impurity region 120 to the back surface 113 of the substrate 110. The connection region 181 may be or comprise a conductive metal and may be in the form of a via, contact or line in a trench. On the back surface 113 of the substrate 110, metal contacts 183, which comprise a conductive metal passing through an insulating layer 185, are electrically connected to each connection region 181. The metal contact 183 may be connected to a metal wire or line 187 on the insulating layer 185. The metal wire or line 187 may be or comprise a conductive metal. Metal wires or lines 187 may be in a grid or matrix to prevent interference with incident light, but are not limited thereto.

Hereinafter, a SPAD pixel structure 9 according to the related art and its problems, and the SPAD pixel structure 1 according to the present disclosure for solving the problems will be described in detail.

Figure 1:
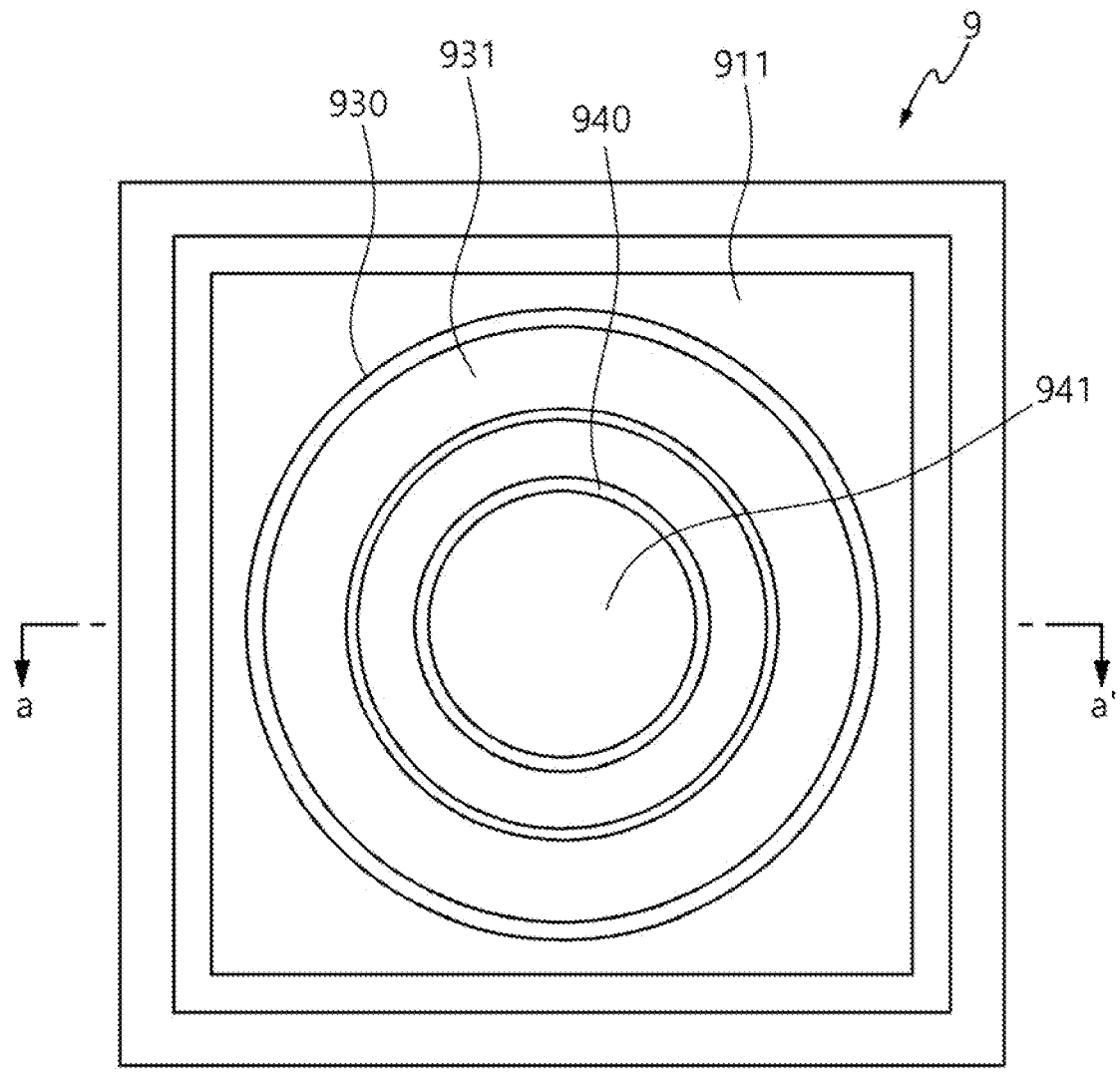
FIG. 1 is a plan view illustrating a SPAD pixel structure according to the related art.
Figure 2:
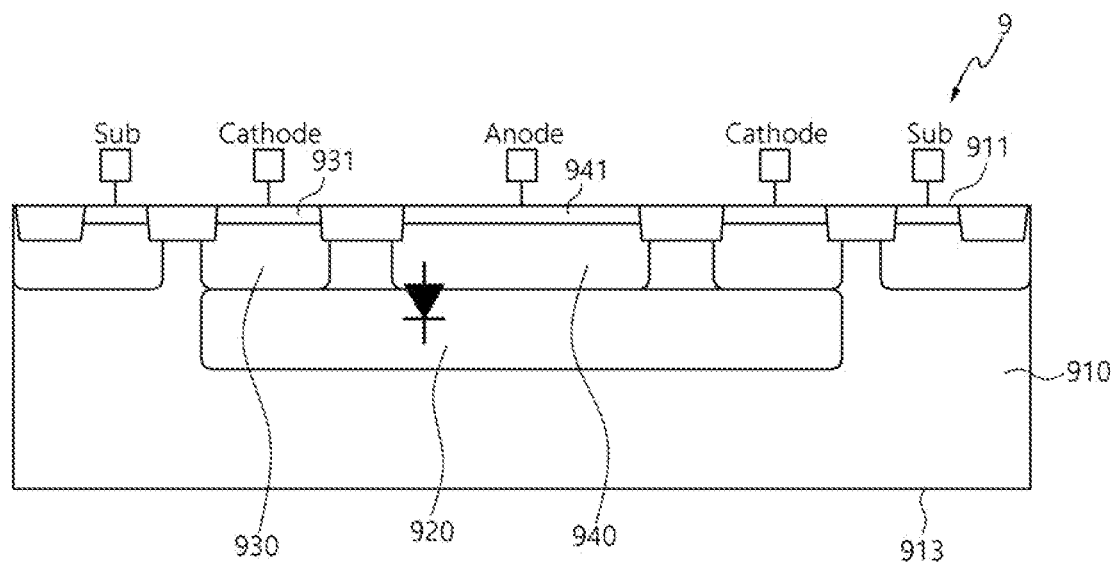
FIG. 2 is a cross-sectional view taken along line a-a' of FIG. 1.

Referring to FIGS. 1 and 2, the SPAD pixel structure 9 according to the related art has a structure including a first conductivity type substrate 910 having a front surface 911 and a back surface 913, a lower N-well 920, and an upper N-well 930 on the N-well 920 and surrounding a P-well 940. In addition, a heavily doped region 931 is on the upper N-well 930 to be electrically connected to a cathode, and a heavily doped region 941 is on the P-well 940 to be electrically connected to an anode. As described above, in the structure 9 according to the related art, both cathode contacts and anode contacts are made on the front surface 911 of the substrate 910, which means that the distance between adjacent unit pixels is not minimized. Also, it is difficult to maximize the fill-factor, resulting in an effective spatial loss.

Figure 3:
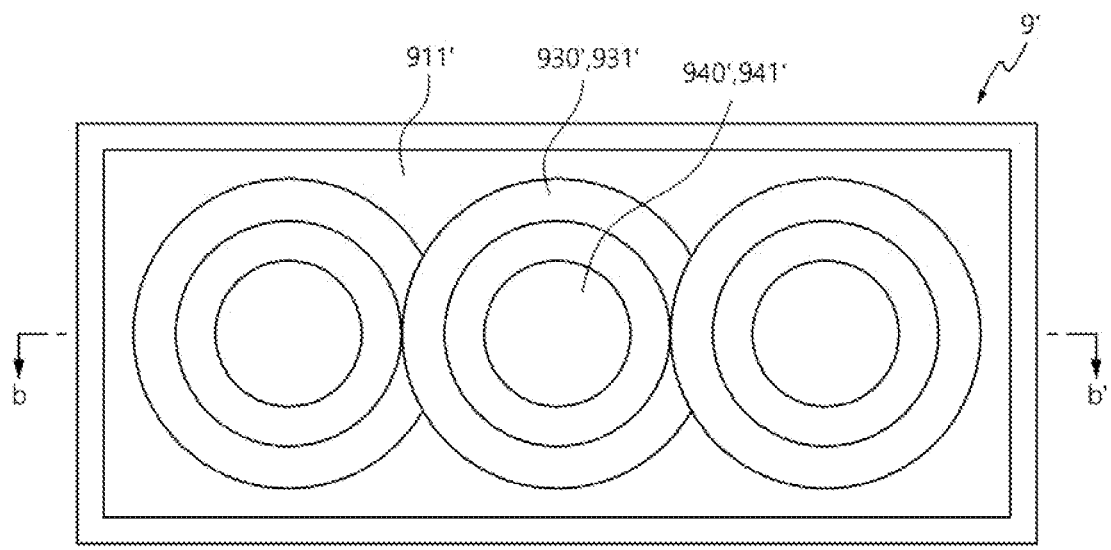
FIG. 3 is a plan view illustrating an improved SPAD pixel structure according to the related art.
Figure 4:
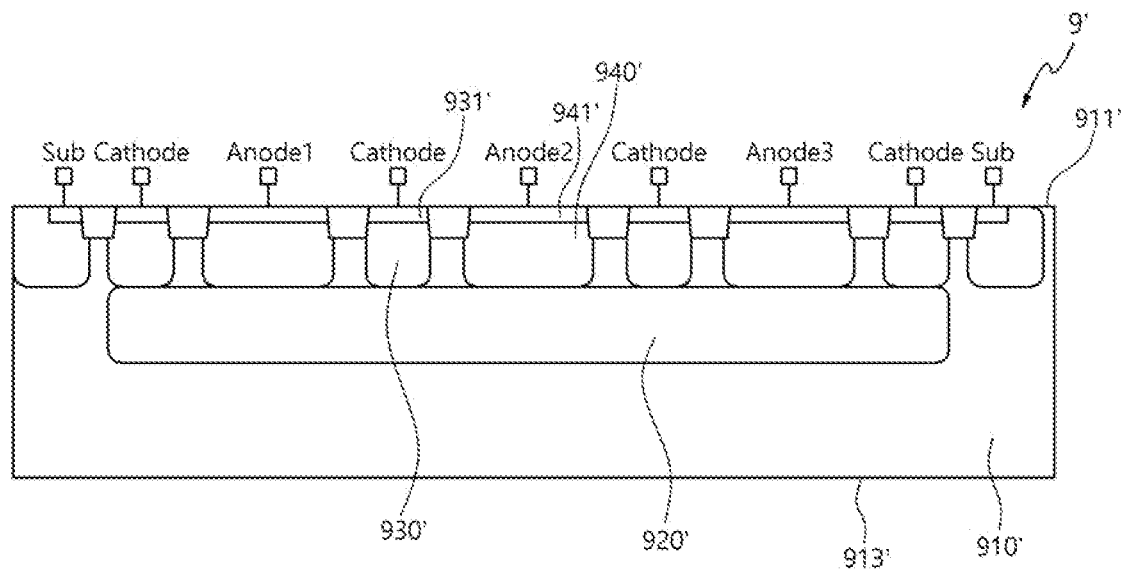
FIG. 4 is a cross-sectional view taken along line b-b' of FIG. 3

Referring to FIGS. 3 and 4, an improved pixel structure 9' for overcoming such a problem has a structure including upper N-wells 930' in each unit pixel P, overlapping each other. This is advantageous over the structure 9 in that the fill-factor is increased by reducing the distance between adjacent unit pixels. However, since each upper N-well 930' still surrounds the outer peripheral surface of a P-well 940', there is a limit to the reduction in the distance between unit pixels.

A novel feature of the SPAD pixel structure 1 according to the present disclosure is that the anode contact is on the front surface 111 of the substrate 110 and the cathode contact is on the back surface 113 of the substrate 110. Therefore, in each unit pixel P, a spatial margin corresponding to at least the width of an upper N-well 930 (and at least one isolation region 160) may be gained. As a result, the fill-factor may be increased. With the structure 1 according to the present disclosure, it is possible to reduce the distance between the unit pixels P by about 25% compared to the improved structure 9' according to the related art.

FIGS. 7 to 14 are reference views illustrating a method of manufacturing a SPAD pixel structure, according to one or more embodiments of the present disclosure.

Hereinafter, the method of manufacturing SPAD pixel structure according to the present disclosure will be described in detail with reference to the accompanying drawings.

Figure 7:
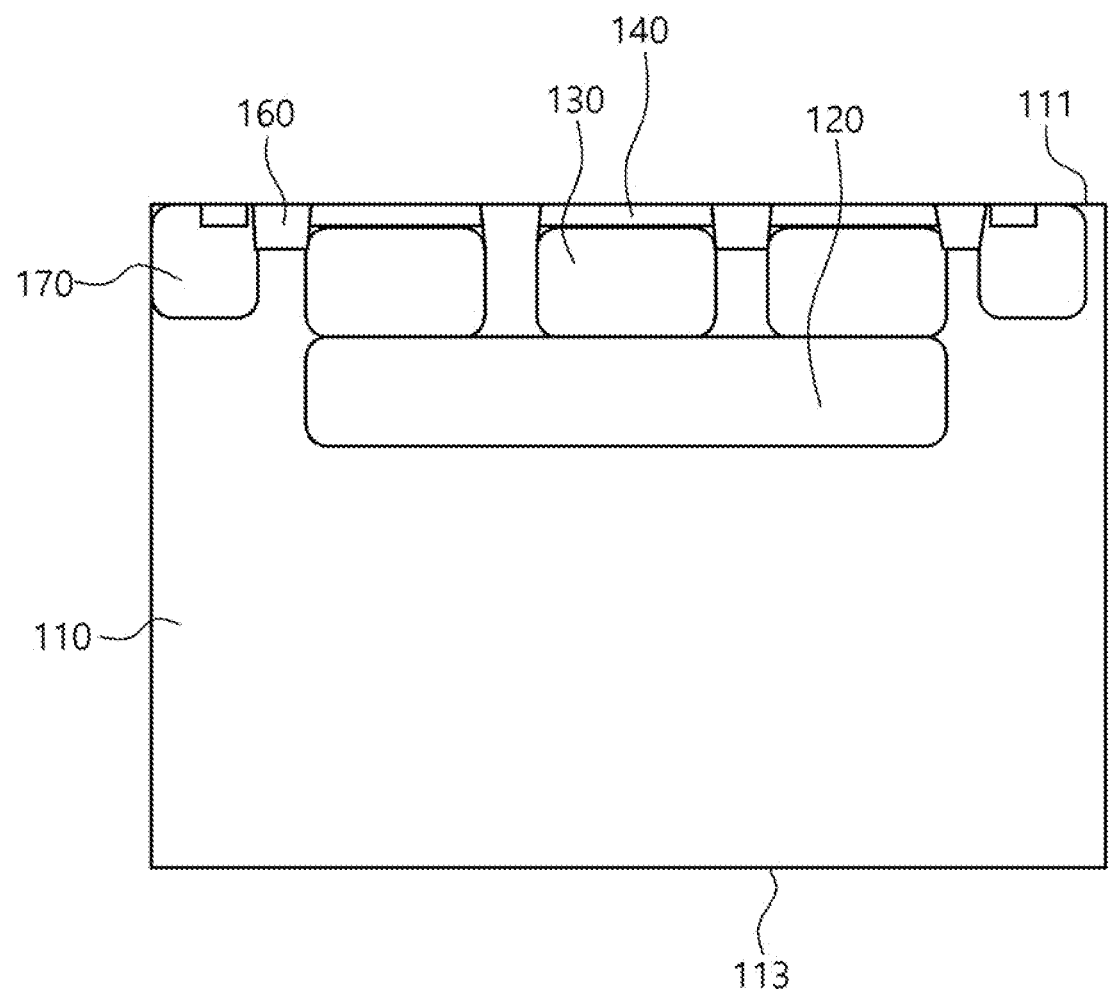
FIGS. 7 to 14 are reference views illustrating a method of manufacturing a SPAD pixel structure, according to one or more embodiments of the present disclosure.

First, referring to FIG. 7, a first impurity region 120 is formed in a substrate 110. The first impurity region 120 may be formed, for example, by forming a mask pattern (not illustrated) on a front surface 111 of the substrate 110, followed by ion implantation. Then, a device isolation layer 160 is formed in the front surface 111 of the substrate 110. The device isolation layer 160 may be formed by a shallow trench isolation (STI) process. Thereafter, a second impurity region 130 is formed in the substrate 110 on the first impurity region 120, and an anode contact 140 is formed on the second impurity region 130. After that, a read-out region 170 is formed at the boundary of an outermost unit pixel P. Each region may be formed by masked ion implantation, but is not limited thereto.

Figure 8:
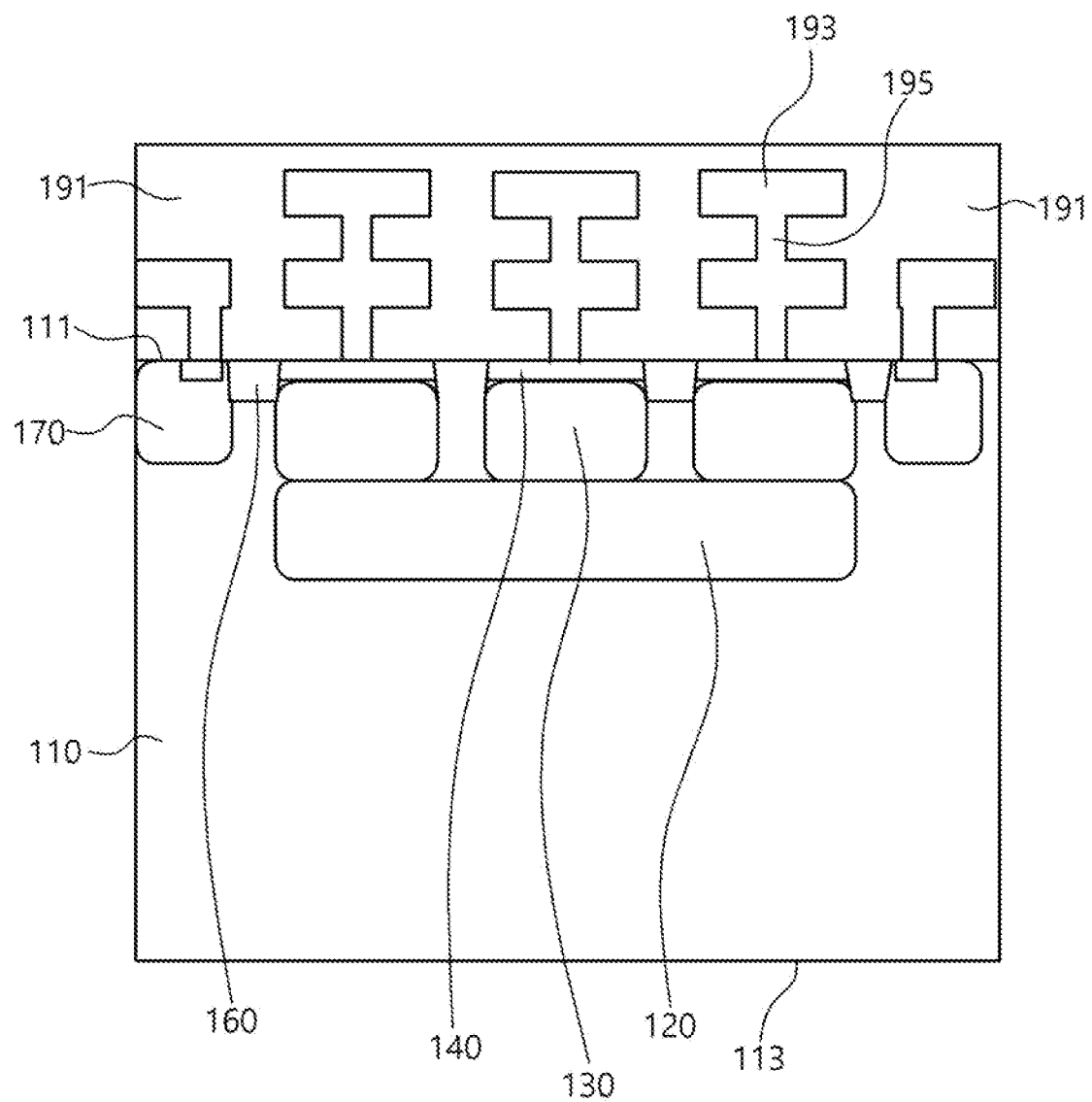

Referring to FIG. 8, an insulating layer 191, a metal wire or line 193, and a metal contact 195 are formed on the front surface 111 of the substrate 110. For example, an interlayer insulating layer may be formed on the front surface 111 of the substrate 110 and etched to form a hole in which the metal contact 195 is to be formed, then the metal contact 195 may be formed by filling the hole with a metal or a metal material, and finally a metal layer may be formed on the interlayer insulating layer and etched to form the metal wire or line 193. The process is then repeated to complete the formation of the insulating layer 191, the metal wire or line 193, and the metal contact 195, with a multi-layer structure. Each metal wire or line 193 and each metal contact 195 may be electrically connected to the anode contact 140 and the read-out region 170.

Figure 9:
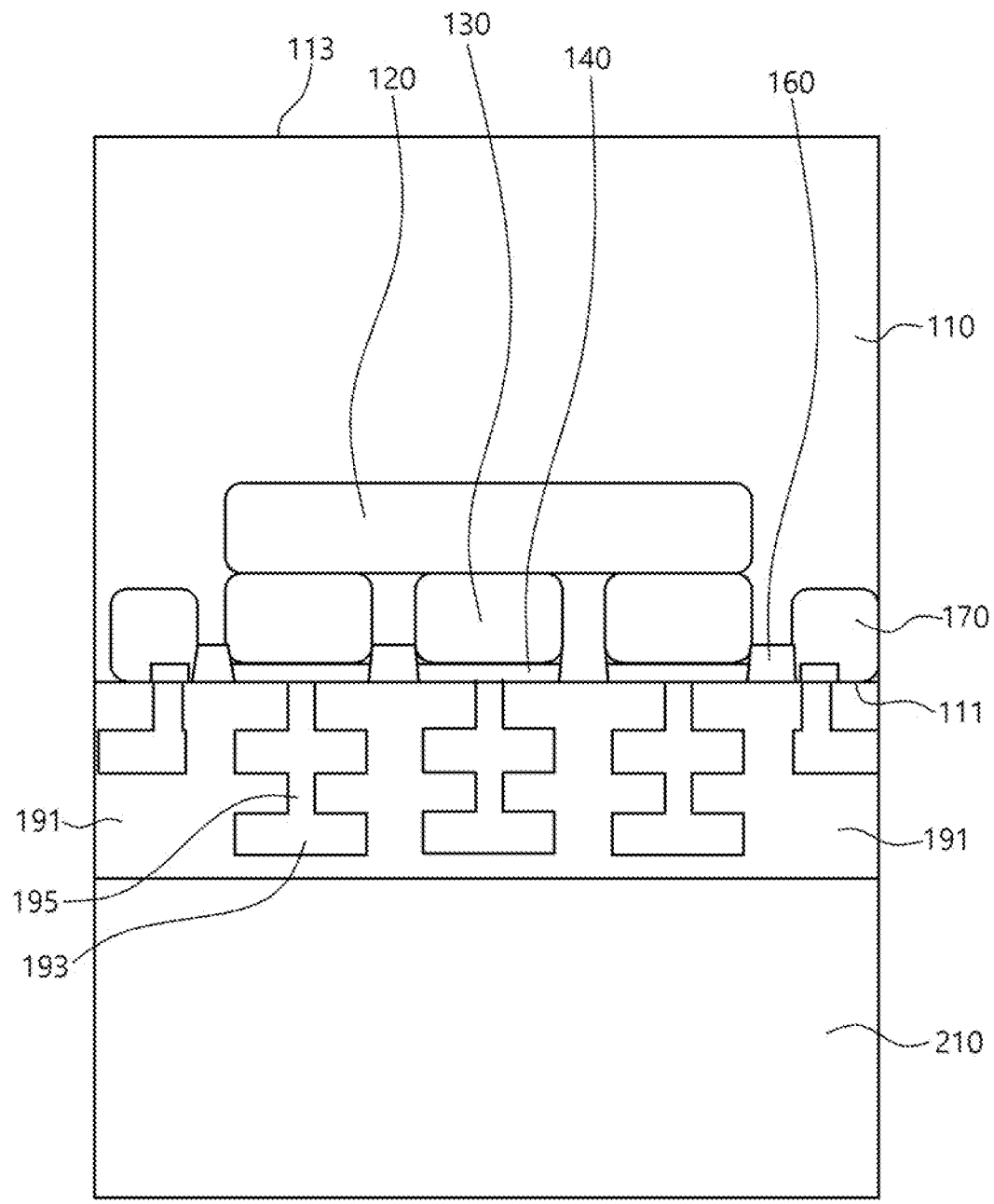

Referring to FIG. 9, the front surface 111 and a back surface 113 of the substrate 110 are reversed, and a support substrate 210 is attached to the front surface 111. This may be performed by wafer bonding. As a result, a stacked structure is formed comprising the support substrate 210, the insulating layer 191, and the substrate 110.

Figure 10:
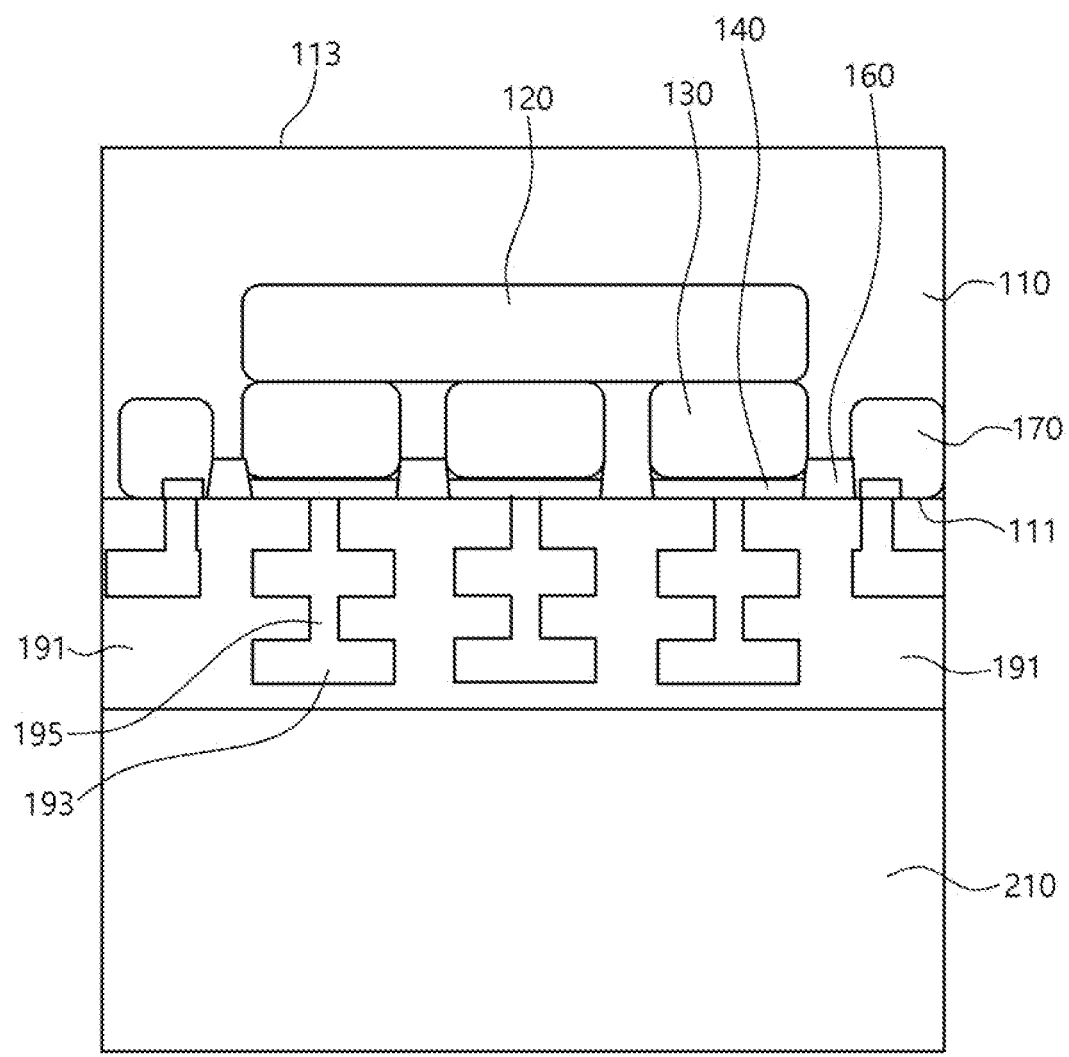

Referring to FIG. 10, a wafer thinning process is performed on the back surface 113 of the substrate 110.

Figure 11:
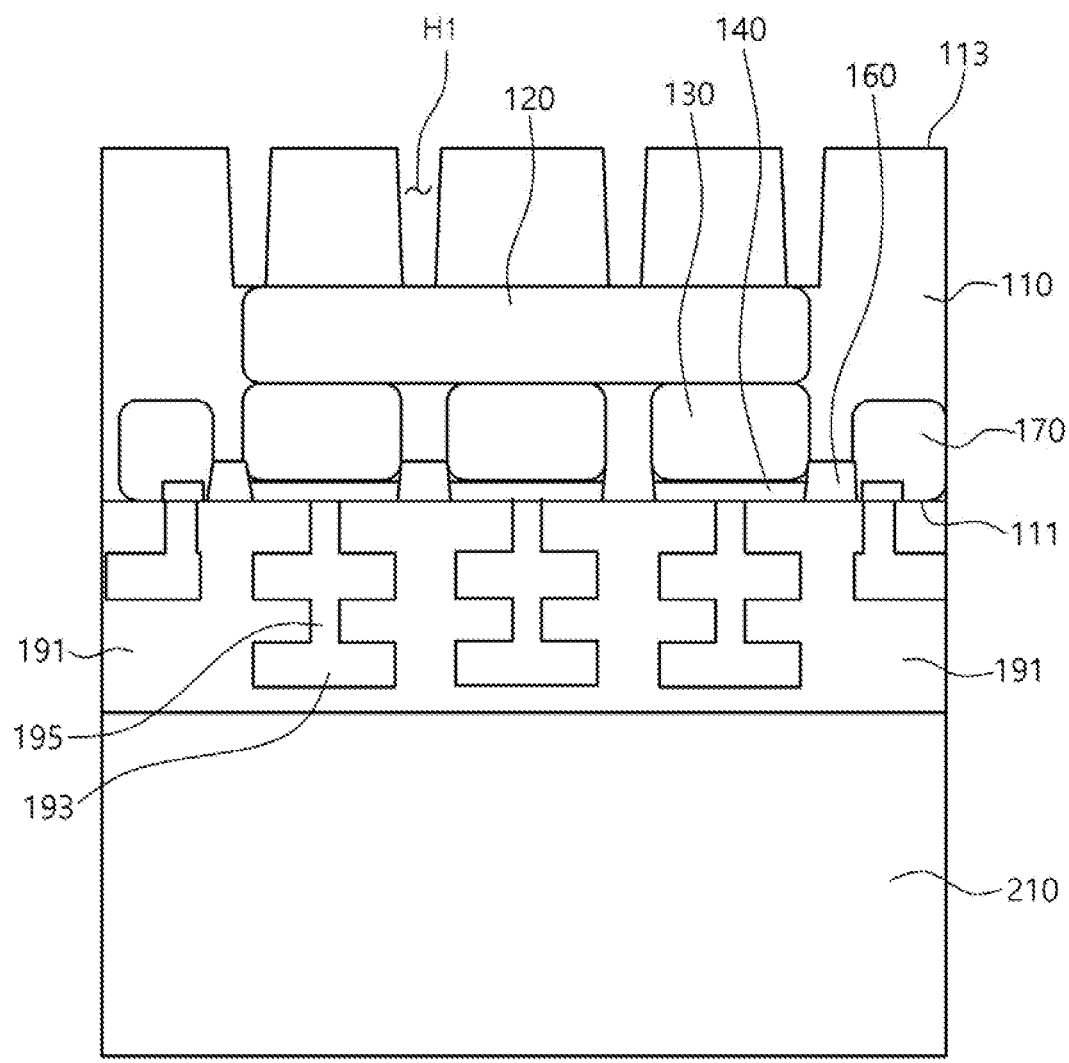

Referring to FIG. 11, a hole H1 is formed from the back surface 113 of the substrate 110 to the first impurity region 120. This hole H1 may be formed by forming a mask pattern (not illustrated) on the back surface 113 of the substrate 110, followed by etching.

Figure 12:
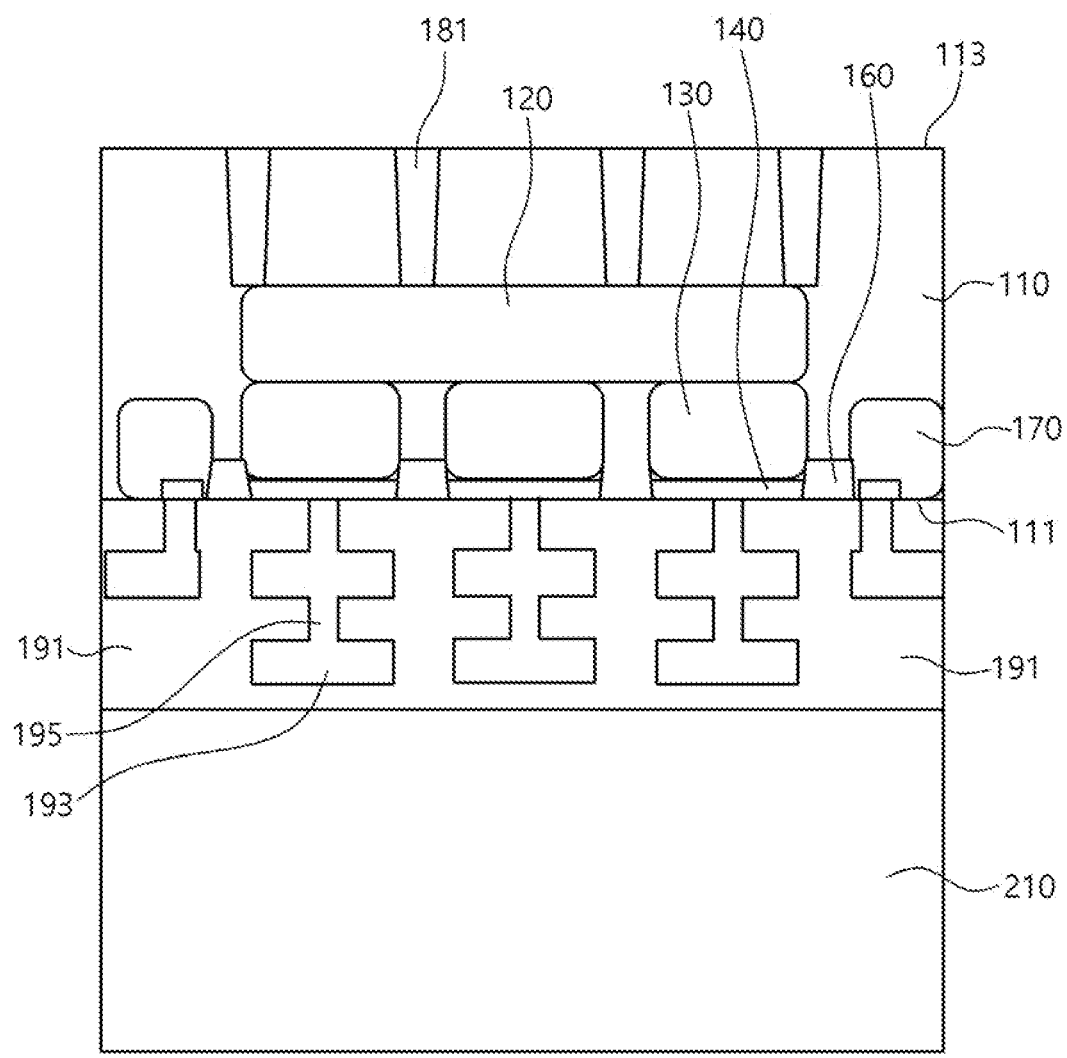

Thereafter, referring to FIG. 12, a connection region 181 is formed by filling the hole H1 with a metal or metal material. For example, the connection region 181 may be formed by depositing a metal layer on the back surface 113 of the substrate 110, filling the contact hole H1, and performing a chemical-mechanical polishing (CMP) process to expose the back surface 113, keeping the metal or metal material in the contact hole H1.

Figure 13:
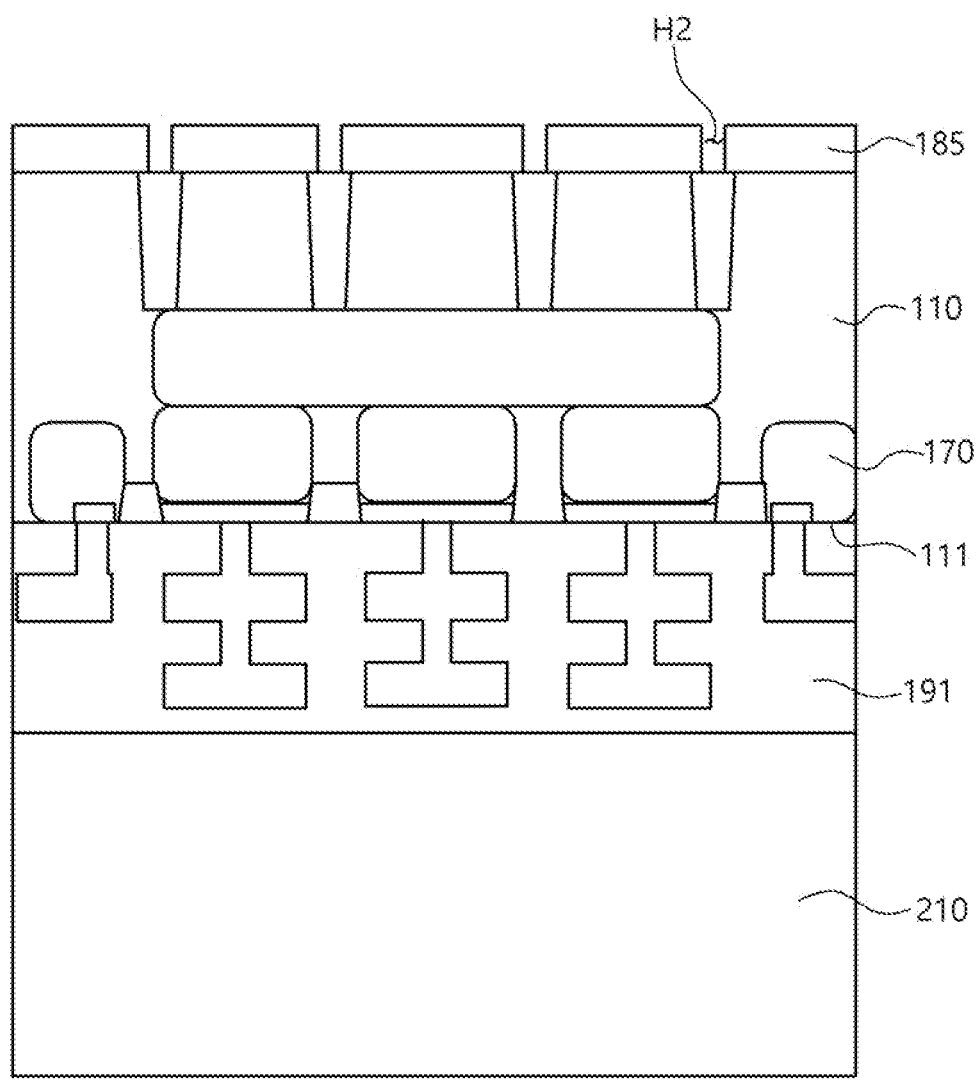
Figure 14:
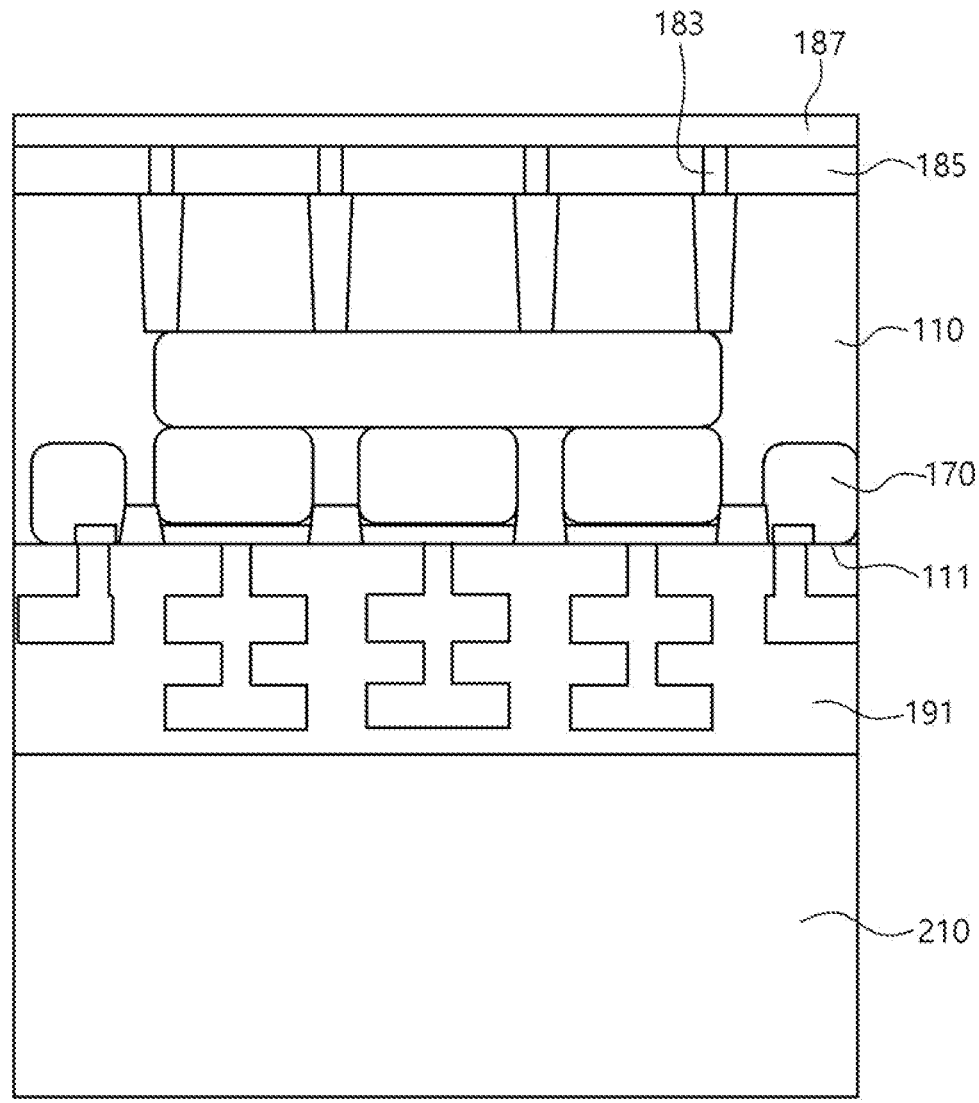

Referring to FIG. 13, a metal contact 183, an insulating layer 185, and a metal wire or line 187 are formed on the back surface 113. For example, the insulating layer 185 may be formed on the back surface 113 of the substrate 110, after which a mask pattern (not illustrated) may be formed on the insulating layer 185, followed by etching to form a hole H2 passing through the insulating layer 185. Referring to FIG. 14, a metal layer is deposited on the surface of the insulating layer 185, filling the hole H2, and a CMP process is performed to expose the surface of the insulating layer 185. Thereafter, the metal wire or line 187 is formed on the insulating layer 185, for example by blanket deposition of a metal layer, photolithographic patterning of a mask thereon, and etching.

The foregoing detailed descriptions may be merely an example of the present disclosure. Also, the inventive concept is explained by describing various embodiments, and can be used through various combinations, modifications, and environments. That is, the inventive concept may be amended or modified without departing from the scope of the technical idea and/or knowledge in the art. The foregoing embodiments are for illustrating the best mode for implementing the technical idea of the present disclosure, and various modifications may be made therein according to specific application fields and uses of the present disclosure. Therefore, the foregoing detailed description of the present disclosure is not intended to limit the inventive concept to the disclosed embodiments.

What is claimed is:

1. A SPAD pixel structure comprising:
    a substrate having a front surface and a back surface on which light is incident;
    a second conductivity type first impurity region across a plurality of unit pixels in the substrate;
    a second conductivity type second impurity region in each of the plurality of unit pixels in the substrate on the first impurity region;
    a first conductivity type anode contact in each of the unit pixels between the front surface of the substrate and the second impurity region;
    a connection region extending from the back surface of the substrate to a back surface of the first impurity region and comprising a conductive metal;
    an insulating layer on the back surface of the substrate; and
    metal wires or lines in a matrix on a back surface of the insulating layer.

2. The SPAD pixel structure of claim 1, wherein the second impurity region has an upper surface adjacent or proximal to the front surface of the substrate.

3. The SPAD pixel structure of claim 2, wherein the second impurity region and the anode contact form a P-N junction adjacent or proximal to the front surface of the substrate.

4. The SPAD pixel structure of claim 1, further comprising:
    an insulating layer on the back surface of the substrate; and
    a metal contact through the insulating layer, comprising a conductive metal, and electrically connected to the connection region.

5. A SPAD pixel structure comprising:
    a substrate having a front surface and a back surface on which light is incident;
    a second conductivity type first impurity region across a plurality of unit pixels in the substrate;
    a second conductivity type second impurity region in each of the unit pixels in the substrate on the first impurity region;
    a first conductivity type anode contact in each of the unit pixels between the front surface of the substrate and the second impurity region;
    connection regions extending from the back surface of the substrate to a back surface of the first impurity region, spaced apart from each other;
    an insulating layer on the back surface of the substrate; and
    metal wires or lines in a matrix on a back surface of the insulating layer.

6. The SPAD pixel structure of claim 5, further comprising:
    an insulating layer on the back surface of the substrate; and
    metal contacts through the insulating layer, each metal contact being electrically connected to an associated one of the connection regions; and
    metal wires or lines on a back surface of the insulating layer, electrically connected to the metal contacts.

7. The SPAD pixel structure of claim 6, further comprising a device isolation layer in the substrate at a boundary between adjacent unit pixels.

8. The SPAD pixel structure of claim 6, further comprising a first conductivity type read-out region at a boundary of an outermost unit pixel.

* * * * *